United States Patent

Knapp

Patent Number: 5,969,548
Date of Patent: Oct. 19, 1999

[54] FREQUENCY DIVIDER WITH LOW POWER CONSUMPTION

[75] Inventor: Herbert Knapp, Munich, Germany

[73] Assignee: Siemens Aktiengesellschaft, Munich, Germany

[21] Appl. No.: 09/157,037

[22] Filed: Sep. 18, 1998

[30] Foreign Application Priority Data

Sep. 18, 1997 [DE] Germany ............................ 197 41 208

[51] Int. Cl.[6] ................................................ H03B 19/00
[52] U.S. Cl. ............................ 327/117; 327/115; 377/48
[58] Field of Search .................... 327/117, 115, 327/113; 377/48, 52, 47, 119

[56] References Cited

U.S. PATENT DOCUMENTS

| | | | |
|---|---|---|---|
| 4,516,251 | 5/1985 | Gallup | 377/110 |
| 4,575,867 | 3/1986 | Hogue | 377/110 |
| 4,953,187 | 8/1990 | Herold | 377/48 |
| 4,991,187 | 2/1991 | Herold | 377/48 |

OTHER PUBLICATIONS

Prof. Manfred Seifart, Verlag Technik GmbH, *Digitale Schaltungen*, 4 Aufl., Berlin, pp. 168–178.
M. Mizuno, et al., IEEE Journal of Solid–State Circuits, *A 3–mW 1.0–GHz Silicon–ECL Dual–Modulus Prescaler IC*, vol. 29, No. 10, Oct. 1994, pp. 1206–1211.
T. Seneff, et al., IEEE Journal of Solid–State Circuits, *A Sub–1 mA 1.5–GHz Silicon Bipolar Dual Modulus Prescaler*, vol. 27, No. 12, Dec. 1992, pp. 1794–1798.

*Primary Examiner*—Tim Callahan
*Assistant Examiner*—Minh Nguyen
*Attorney, Agent, or Firm*—Hill & Simpson

[57] ABSTRACT

A frequency divider or dual module prescaler having a division factor switchable between 1/N and 1/(N+1) with an input signal frequency of approximately 1 GHz. The divider includes only one input flip-flop to process the input signal and an intermediate signal having half the frequency as supplied to a divider expansion either directly, or in inverted.

1 Claim, 2 Drawing Sheets

FREQUENCY DIVIDER WITH LOW POWER CONSUMPTION

BACKGROUND OF THE INVENTION

The present invention generally relates to frequency divider circuits. In particular, the invention relates to what are referred to as "dual module prescalers" such as are employed in frequency synthesizers in mobile telephone communication systems. Such frequency dividers exhibit division factors switchable between 1/N and 1/(N+1), where N typically is a number such as 64 or 128. These frequency dividers work with frequencies on the order of magnitude of 1 GHz and are a component part of every GSM or DECT telephone. Due to the use of battery supplies in such devices, low power consumption is of rather critical significance.

Examples of the use and structure of such prescalers are provided in the IEEE Journal of Solid-State Circuits, Vol. 29, No. 10, October 1994, pages 1206 through 1211, and as Volume 27, No. 12, December 1992, pages 1794 through 1798. The disclosures of these articles are fully incorporated herein by reference. In these disclosed devices, further asynchronous divider expansion or expander stages respectively follow a synchronous 1:4/5 divider (also referred to as a divide by 4/5 or ÷4/5).

SUMMARY OF THE INVENTION

An object of the invention is to provide a dual module prescaler or frequency divider that exhibits an especially low power consumption.

To that end, in an embodiment, the invention provides a frequency divider, comprising a frequency halver positioned on an input side to form an intermediate signal exhibiting a frequency f/2 from an input signal having a frequency f; a synchronized inverter that, subject to the control of a control signal, directly through-connects the intermediate signal to an input of the divider expander in the case of a desired division factor of 1/N or, through-connects the intermediate signal into the input of the divider expander in an inverted condition after N periods and synchronized with the intermediate signal in the case of a desired division factor of 1/(N+1), wherein, an output of the divider expander supplies to an output signal having the frequency f/N or, respectively, f/(N+1).

In an embodiment, the invention provides a frequency divider as set forth above, wherein the synchronized inverter comprises a delay element, a first hold element, a second hold element, an exclusive OR gate and a NAND gate; whereby an inverted output signal is supplied to a first input of the NAND gate and the inverted control signal is supplied to the second input of the NAND gate and an output of the NAND gate supplies a trigger signal to the second hold element whose inverted output is connected to the input of the first and second hold elements; wherein the intermediate signal is supplied to an input of the delay element and to a trigger input of the first hold element; and whereby an output signal of the delay element that exhibits the same running time as the first hold element is supplied to a first input and a non-inverted output signal of the first hold element is supplied to a second input of the exclusive OR gate whose output supplies a trigger signal for the divider expander.

An advantage of this latter embodiment is that only the output signal of a stage of the expansion divider is employed for the switching between the division factors 1/N and 1/(N+1), and current and chip area are thus saved.

A preferred exemplary embodiment of the invention is explained in greater detail below in the following description of the presently preferred embodiment with reference to the drawings.

DETAILED DESCRIPTION OF THE PRESENTLY PREFERRED EMBODIMENTS

In accordance with the invention, and with reference to the disclosure in the previously referred to IEEE articles, a synchronous 1:4/5 divider (or ÷4/5 counter) that is otherwise standard is not employed at the input of a prescaler. Rather, an intermediate signal having a frequency f/2 is initially formed an input signal IN having the frequency f. As a result, only one flip-flop need be operated with the maximum frequency f. This is a reduction from the usual three flip-flops that are employed at that stage. Thus, current consumption can be significantly reduced given the indicated values for N.

Figure 1:
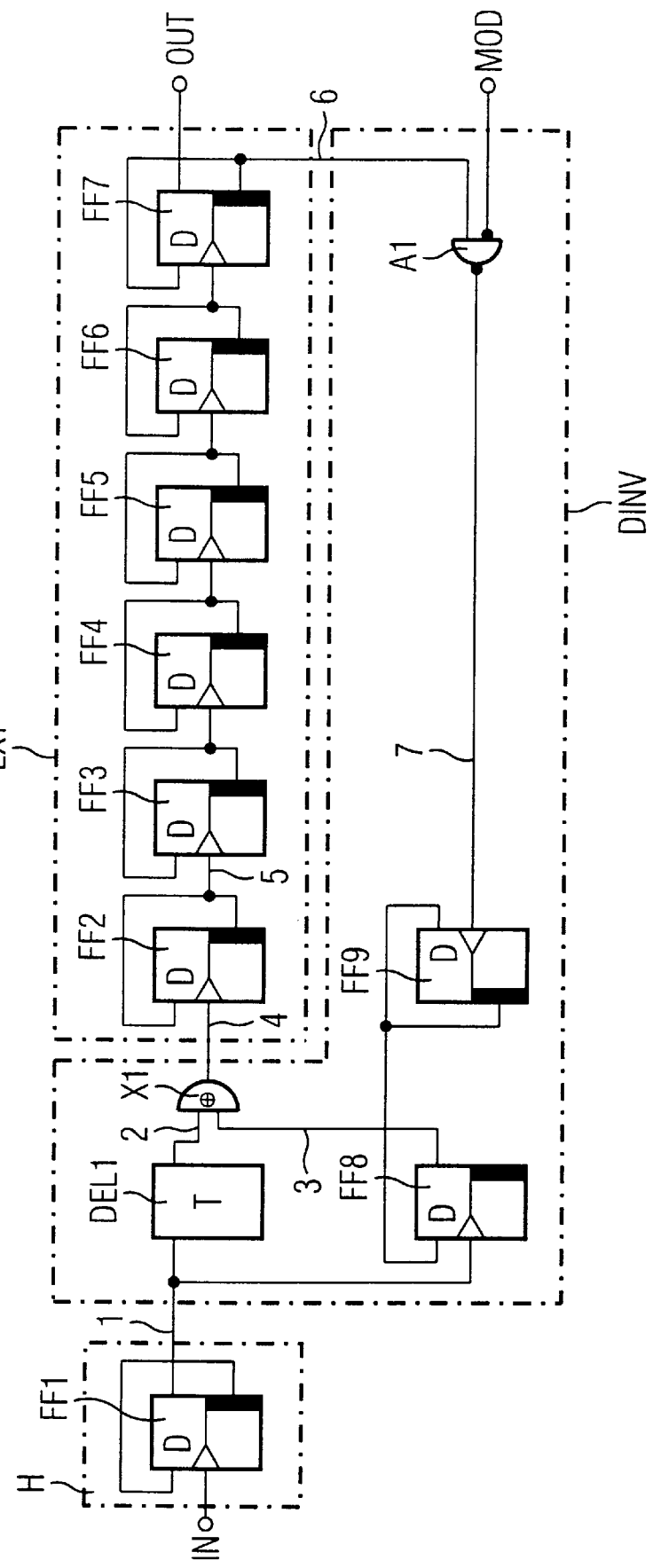
FIG. 1 illustrates a circuit diagram of a preferred embodiment of the invention.

By way of example, FIG. 1 illustrates a frequency divider for division factors 1/128 and 1/129. The frequency divider comprises a frequency halver H on the input side, a means for synchronized inversion (DINV) and a divider expansion or divider expander EXT. The frequency halver H generates an intermediate signal 1 having a frequency f/2 from an input signal IN having the frequency f. Subject to the control of a control signal MOD, a direct through-connection is undertaken to a clock input of a first stage of the divider expansion EXT that carries a clock signal 4 in the case of a desired division factor 1/N=1/128. When the division factor 1/(N+1)=1/129 is desired, the control MOD inverts the intermediate signal I after N periods and is through-connected to the clock input of the divider expansion EXT delayed by half the period duration of the intermediate signal 1. The output signal OUT in both instances is taken from the output of the last stage FF7 of the divider expansion EXT.

The frequency halver H shown in FIG. 1 is illustrated as comprised of a D flip-flop FF1 triggered by positive signal edges whose inverted output is fed back into the input D, whose clock input is wired to the input signal IN of the frequency dividers, and whose non-inverted output supplies the intermediate signal 1 having the frequency f/1. The intermediate signal 1 is supplied to an input of a delay element DEL1 and to a trigger input of a first hold element FF2. The output signal 2 of the delay element DEL1, which exhibits the same running time as the first hold element FF8, is supplied to a first input, and a non-inverted output signal of the first hold element FF8 is supplied to a second input of the exclusive OR (EXOR) gate X1 (the term "exclusive OR" being a well known logical expression which can be implemented by well known techniques and/or electronic elements) whose output supplies the clock signal 4 for the divider expansion EXT. The divider expansion EXT is thereby composed of flip-flops FF2 through FF7 and forms an asynchronous frequency divider having the division factor $1/2^6$. The EXOR gate thereby serves as a control inverter, whereby the intermediate signal 1 forms the clock signal 4 for the flip-flop FF2, which is unmodified given the low level at the second input. By contrast, given a high level or EXOR gate X1 inverts the clock signal 4 of the flip-flop FF2. Since the second input of the EXOR gate is connected to the output of the flip-flop FF8, the condition of the flip-flop FF2 decides whether the signal is inverted or not. The output of a NAND circuit A1 (the term "NAND" being a well known for meaning logical "not and" and which can be implemented by well known techniques and/or electronic elements) remains at high as long as the control signal remains at a high level and, thus, the flip-flops FF8 and FF9 are maintained in their respective conditions.

The flip-flops FF1 through FF7, therefore, work as a frequency divider with a division factor of $1/2^7$ or, respectively, 1/128.

When the control signal MOD is at a low level, the flip-flop FF9 and, thus, the flip-flop FF8, change their condition at every clock period of the output signal OUT. Every change at the output of the flip-flop FF8 effects an inversion of the clock signal 4 with reference to its preceding condition, this corresponding to a phase shift by 180°. Since the frequency at the input of the flip-flop FF2 is half as high as at the input of the frequency divider, this corresponds to a phase shift of 360° or one period with reference to the input frequency. This shift by one period effects the desired switching of the division factor from 1/128 to 1/129.

Figure 2:
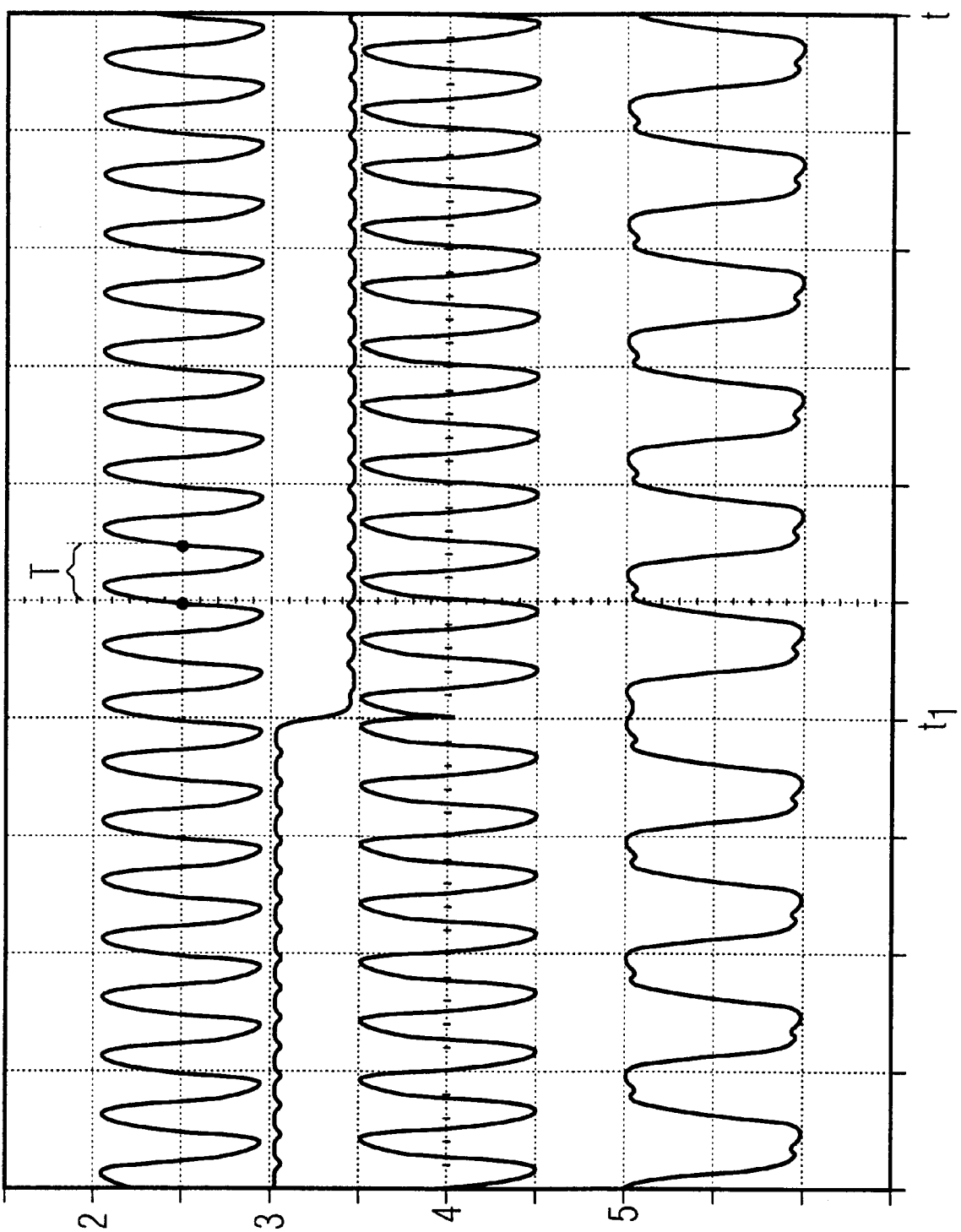
FIG. 2 illustrates a timing diagram used for explaining the functions of the circuits in FIG. 1.

FIG. 2 illustrates a timing diagram of signals 2 through 5, wherein the signal 2—because of the high frequency—is no longer rectangular but approximately sinusoidal and has a period duration T. At a time $t_1$, a signal 3 switches from a high level to a low level. Signal 4 then exhibits a phase shift of 180° at time $t_1$. Signal 5 at the output of the flip-flop FF2, therefore, changes from high to low only with a delay. The delay thereby exactly corresponds to one period of the input frequency. The flip-flop FF8 assures that the inversion occurs exactly in the zero-axis crossing of the signal 2. This is required in order to prevent the occurrence of brief noise pulses in the output signal 4 of the EXOR gate at the switch-over time. The flip-flop FF8 is, therefore, triggered by the intermediate signal 1. The delay element DEL1 simulates the running time of the flip-flop FF8, so that a level change of the flip-flop FF8 always coincides in time with a level change of the signal 2.

Although modifications and changes may be suggested by those skilled in the art, it is the intention of the inventors to embody within the patent warranted hereon all changes and modifications as reasonably and properly come within the scope of their contribution to the art.

I claim:
1. A frequency divider, comprising:
a frequency halver positioned on an input side to form an intermediate signal exhibiting a frequency f/2 from an input signal having a frequency f;
a synchronized inverter that, subject to the control of a control signal, directly through-connects the intermediate signal to an input of a divider-expander given a division factor of 1/N or, through-connects the intermediate signal into the input of the divider expander in an inverted condition after N periods of the input signal and synchronized with the intermediate signal given a division factor of 1/(N+1),
wherein,
an output of the divider expander supplies an output signal having either the frequency f/N or, respectively, f/(N+1);
the synchronized inverter comprises a delay element, a first hold element, a second hold element, an exclusive OR gate and a NAND gate;
an inverted output signal of the frequency divider circuit is supplied to a first input of the NAND gate and the control signal is supplied inverted to a second input of the NAND gate and an output of the NAND gate is supplied to a trigger signal input of the second hold element;
an inverted output of the second hold element is coupled both to an input of the second hold element and an input of the first hold element;
the intermediate signal is supplied to an input of the delay element and to a trigger signal input of the first hold element;
an output signal of the delay element that exhibits a running time which is the same as that of the first hold element is supplied to a first input of the exclusive OR gate and a non-inverted output signal of the first hold element is supplied to a second input of the exclusive OR gate; and
an output of the exclusive OR gate is supplied to a trigger signal input of the divider expander.

* * * * *